United States Patent [19]

Kashiwa

[11] Patent Number: 5,563,551
[45] Date of Patent: Oct. 8, 1996

[54] IMPEDANCE MATCHING CIRCUIT

[75] Inventor: Takuo Kashiwa, Itami, Japan

[73] Assignee: Mitsubishi Denki Kabushiki Kaisha, Tokyo, Japan

[21] Appl. No.: 511,151

[22] Filed: Aug. 4, 1995

[30] Foreign Application Priority Data

Aug. 30, 1994 [JP] Japan ...................................... 6-204954

[51] Int. Cl.$^6$ ................................ H03F 3/60; H01P 5/02
[52] U.S. Cl. .............................. 330/277; 330/286; 333/33
[58] Field of Search ....................... 333/33, 116; 330/277, 330/286

[56] References Cited

U.S. PATENT DOCUMENTS

| 3,965,445 | 6/1976 | Ou .............................................. 333/33 |
| 4,275,364 | 6/1981 | Skatvold, Jr. ............................ 333/33 |
| 4,390,851 | 6/1983 | Higgins et al. ...................... 330/286 X |
| 4,623,848 | 11/1986 | Saka et al. ............................ 330/286 |
| 5,111,165 | 5/1992 | Oldfield ................................. 333/116 |
| 5,187,459 | 2/1993 | Russel et al. ......................... 333/204 |

FOREIGN PATENT DOCUMENTS 0547871   6/1993   European Pat. Off. .

OTHER PUBLICATIONS

Wang et al, "High–Performance W–Band Monolithic Pseudomorphic InGaAs HEMT LNA's And Design/Analysis Methodology", IEEE Transactions on Microwave Theory and Techniques, vol. 40, Number 3, Mar. 1992, pp. 417–427.

Primary Examiner—Paul Gensler
Attorney, Agent, or Firm—Leydig, Voit & Mayer

[57] ABSTRACT

An impedance matching circuit employed at a high frequency includes a coupling line having a length longer than ¼ of a wavelength at a design center frequency. Therefore, the impedance can be inductive and it is possible to impedance match a circuit comprising a transistor and having a capacitive impedance. The impedance matching circuit according to the present invention functions both as a dc blocking capacitor and an impedance matching circuit. Therefore, the degree of freedom in the circuit design is increased and the circuit can be reduced in size.

14 Claims, 6 Drawing Sheets

IMPEDANCE MATCHING CIRCUIT

FIELD OF THE INVENTION

The present invention relates to a high frequency impedance matching circuit and more particularly, it relates to an impedance matching circuit for micro-wave and millimeter-wave band integrated circuits.

BACKGROUND OF THE INVENTION

Conventionally, in micro-wave band and millimeter-wave band integrated circuits (hereinafter, referred to as an IC), a coupling line having a length which is one-fourth (¼) as long as a wavelength of its design center frequency band is employed in a dc blocking capacitor used in interstage coupling because the insertion loss of the coupling line is small. The coupling line is sometimes referred to as edge coupled transmission lines and includes two closely spaced transmission line lengths disposed side-by-side so that electromagnetic waves are transferred, i.e., coupled, from one transmission line to the other along the respective edges of the transmission lines. FIG. 8 is a plan view showing first and second amplification stages in a 90 GHz band amplifier IC as an example. In FIG. 8, reference numeral 1 designates a field effect transistor (hereinafter, referred to as an FET) at the first amplification stage, numeral 2 designates an output side impedance matching circuit at the first amplification stage, numeral 3 designates the above-described coupling line with the ¼ wavelength (hereinafter, referred to as ¼ wavelength coupling line), numeral 4 designates an input side impedance matching circuit at the second amplification stage, and numeral 5 designates an FET at the second amplification stage. In addition, reference characters G, S and D designate a gate, a source, a drain, respectively. However, a dc bias circuit for driving the FET, an input side impedance matching circuit at the first amplification stage and an output side impedance matching circuit at the second amplification stage are omitted in FIG. 8. The above-described impedance matching circuit and the coupling line are formed of a metal film on a substrate. The length $L_c$ of the coupling line is equal to $\lambda/4$ where $\lambda$ is a wavelength of the transmission line at the design center frequency.

In this case, the I/O impedance of the ¼ wavelength coupling line is normally 50Ω. In order to perform the above impedance matching, the I/O impedance at each amplification stage is 50Ω at the edge of the impedance matching circuit. Generally, as the frequency becomes high, the impedance matching circuit and the ¼ wavelength coupling line can be miniaturized. However, a length $L_{om}$ of the output side impedance matching circuit at the first amplification stage is approximately 350 μm and the length $L_c$ of the ¼ wavelength coupling line is approximately 300 μm in the above example of a 90 GHz band IC, so that the impedance matching circuit and the coupling line occupy a large area in the millimeter-wave IC. Consequently, the chip size can not be significantly reduced.

In the micro-wave and millimeter-wave IC, it is desired that mass productivity be improved and manufacturing costs be reduced by reducing the chip size. However, as above-described, since the prior art impedance matching circuit and the coupling line whose lengths are decided mostly by the frequency occupy a large area, it is difficult to reduce the chip size of the IC.

SUMMARY OF THE INVENTION

It is an object of the present invention to reduce a chip size of a micro-wave and millimeter-wave IC by reducing lengths of an impedance matching circuit and a coupling line.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, in an impedance matching circuit employed at a high frequency, a coupling line having a length longer than ¼ of a wavelength of the design center frequency is provided. Therefore, the impedance can be inductive and it is possible to perform impedance matching with a circuit comprising a transistor and having a capacitive impedance. In the prior art, in order to connect the circuit having a capacitive impedance with a dc blocking ¼ wavelength coupling line, it was necessary to insert an impedance matching circuit between them. The impedance matching circuit according to the present invention functions as both the dc blocking coupling line and the prior art impedance matching circuit. Therefore, by employing an impedance matching circuit comprising a coupling line according to the present invention instead of the prior art impedance matching circuit and the prior art dc blocking ¼ wavelength coupling line, the degree of freedom in circuit design is increased and the circuit can be miniaturized.

Even in a case where two circuits having different impedances are connected with the dc blocking ¼ wavelength coupling line, it was necessary to insert an impedance matching circuit between each of the circuits and ¼ wavelength coupling line in the prior art. Meanwhile, the impedance matching circuit according to the present invention can perform impedance matching for either of two circuits, without requiring two impedance matching circuits as in the prior art. Therefore, two circuits having different impedances can be connected with the impedance matching circuit comprising a coupling line, whereby the degree of freedom in the circuit design is further increased and the circuit is further miniaturized.

The miniaturization of the circuit improves mass productivity and reduces manufacturing costs.

According to a second aspect of the present invention, in the above-described impedance matching circuit, a transistor is connected to one end of the coupling line and a dc bias circuit for driving the transistor is connected to any position of the coupling line and impedance of the dc bias circuit viewed from the coupling line at the design center frequency is infinite. Therefore, the dc bias circuit which was connected to the electrode of the transistor or the transmission line in the vicinity of the electrode in the prior art can be also connected to any position of the coupling line. Consequently, the degree of freedom of the circuit design is further increased.

Accordingly, the substrate on which the circuits are formed can be effectively employed and the circuit can be further miniaturized. Thus, the mass productivity of the circuit can be improved and the manufacturing costs can be reduced.

According to a third aspect of the present invention, in the above-described impedance matching circuit, since a stub is connected to a predetermined position of the coupling line, the range of impedance which can be matched is increased and the prior art ¼ wavelength coupling line and two impedance matching circuits connected to both ends thereof can be easily replaced with the impedance matching circuit comprising the coupling line according to the present invention. Thus, the degree of freedom of the circuit design can be further increased.

Therefore, the substrate on which the circuits are formed can be effectively employed and the circuit can be further miniaturized. Thus, the mass productivity of the circuit can be improved and the manufacturing costs can be reduced.

According to a fourth aspect of the present invention, in the above-described impedance matching circuit, since it is provided in a high frequency IC, the circuit can be miniaturized, the degree of freedom of the circuit design can be increased and the substrate on which the IC is formed can be effectively employed.

Therefore, the chip size of the IC can be reduced, whereby the mass productivity of the IC is improved and the manufacturing costs can be reduced.

According to a fifth aspect of the present invention, in the above-described impedance matching circuit, since it is connected to the input side or the output side of the transistor in the high frequency IC, the input side or the output side capacitive impedance of the transistor can be matched by enabling the impedance of the impedance matching circuit of the present invention to be inductive. In the prior art, in order to connect a transistor having the capacitive impedance to the dc blocking ¼ wavelength coupling line as described above, it is necessary to insert the impedance matching circuit between them. Meanwhile, the impedance matching circuit according to the present invention functions as the dc blocking coupling line and the prior art impedance matching circuit. Therefore, the prior art impedance matching circuit and the prior art dc blocking ¼ wavelength coupling line can be replaced with an impedance matching circuit comprising the coupling line according to the present invention.

In addition, in a case where two transistors were connected by employing a dc blocking ¼ wavelength coupling line, it was necessary to insert the impedance matching circuit between each of the transistors and the ¼ wavelength coupling line in the prior art. Meanwhile, the impedance matching circuit according to the present invention can perform impedance matching for the above-described two transistors, whereby it is not necessary to use two impedance matching circuits. More specifically, the above two transistors can be connected by only the impedance matching circuit comprising the coupling line of the present invention.

In addition, the dc bias circuit for driving the transistor of which the impedance viewed from the coupling line at the design center frequency is infinite can be connected to any position of the impedance matching circuit comprising the coupling line of the present invention.

Furthermore, impedance matching is realized over a larger range by connecting the stub to any position of the impedance matching circuit comprising the coupling line of the present invention.

As described above, the degree of freedom of the circuit design is increased and the circuit can be miniaturized. Therefore, the chip size of the IC can be reduced. Consequently, mass productivity of the IC is improved and manufacturing costs can be reduced.

DETAILED DESCRIPTION OF THE PREFERRED EMBODIMENTS

Embodiment 1

A first embodiment of the present invention will be described.

Figure 1:
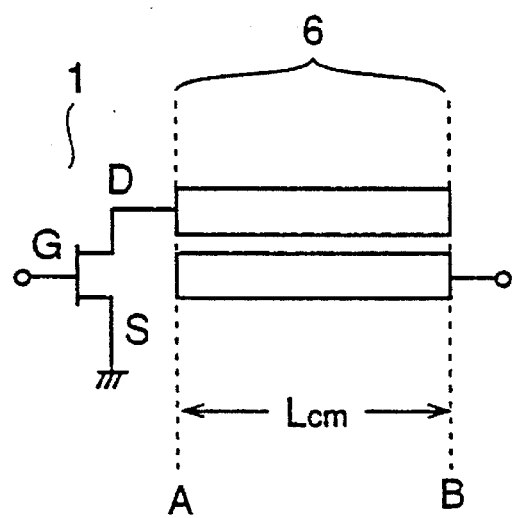
FIG. 1 is a plan view showing an impedance matching circuit comprising a coupling line according to a first embodiment of the present invention.

This embodiment of the present invention relates to an impedance matching circuit functioning at a frequency of about 90 GHz band. FIG. 1 shows a plan view of an impedance matching circuit of this embodiment. In FIG. 1, reference numeral 1 designates an FET at a first amplification stage and reference numeral 6 designates an impedance matching circuit comprising a coupling line. In this case, length $L_{cm}$ of the coupling line 6 is set at approximately 450 µm which is longer than the length of $\lambda/4$ (approximately 300 µm) of the prior art by approximately 150 µm, so that the coupling line serves as the output side impedance matching circuit at the first amplification stage, where $\lambda$ is the wavelength of design center frequency.

In general, the condition for impedance matching between the two circuits in a case where the two circuits are connected, is that the respective impedances of the circuits viewed from the connecting point of them are complex conjugates. According to the first embodiment, by increasing the length of the coupling line 6 to be longer than $\lambda/4$, the impedance can be inductive (reactance is positive) and it can be directly matched with the capacitive impedance (reactance is negative) of the FET 1.

Figure 2:
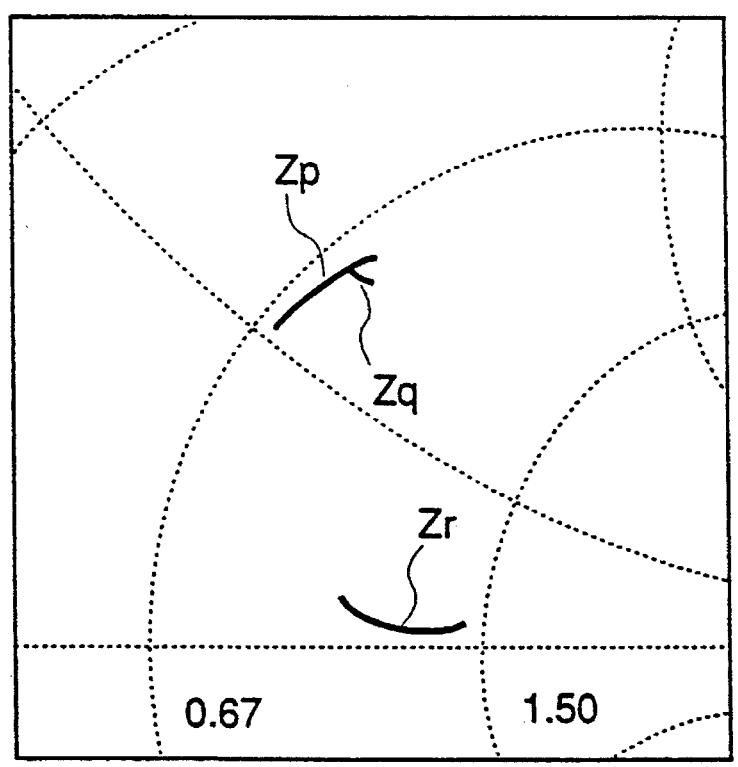
FIG. 2 is a Smith chart on which impedances of the impedance matching circuit comprising the coupling line according to the first embodiment of the present invention are presented.

FIG. 2 illustrates a Smith chart on which impedances of the impedance matching circuit 6 in a frequency range of 90–100 GHz are presented, in which Zp is the impedance of the impedance matching circuit 6 comprising a coupling line viewed from a position of broken line A in FIG. 1, Zq is a complex conjugate of the impedance of the FET 1 viewed from the position of broken line A, and Zr is an impedance of the impedance matching circuit 6 comprising the coupling line viewed from a position of broken line B. A normalized impedance viewed from the position A of the impedance matching circuit 6 at a frequency of 90 GHz is 0.724+j0.7487 (inductive impedance) and the complex conjugate of the normalized impedance of the FET 1 viewed from the position A, i.e., 0.756−j0.799 (capacitive impedance), is 0.756+j0.799, meaning that impedance matching is almost perfectly realized. Meanwhile, as can be seen from FIG. 2, the impedance of the impedance matching circuit 6 viewed from the position B is in the vicinity of 50Ω (a point of 1.0 on the Smith chart) and the input impedance at the second amplification stage is also 50Ω, meaning that impedance matching is also realized.

The impedance matching circuit according to the first embodiment of the present invention can be regarded as one that is obtained by combining a prior art output side impedance matching circuit at the amplification stage and a dc blocking ¼ wavelength coupling line which is employed for interstage coupling. Since the length $L_{om}$ of the prior art output side impedance matching circuit at the amplification stage is approximately 350 μm and the length $L_c$ of the dc blocking coupling line is approximately 300 μm, the sum of them, $L_{om}+L_c$, is approximately 650 μm. Meanwhile, the length $L_{cm}$ of the impedance matching circuit according to this embodiment is approximately 450 μm, which is shorter by approximately 200 μm than the prior art example. Consequently, the chip size of the IC can be miniaturized.

Figure 3:
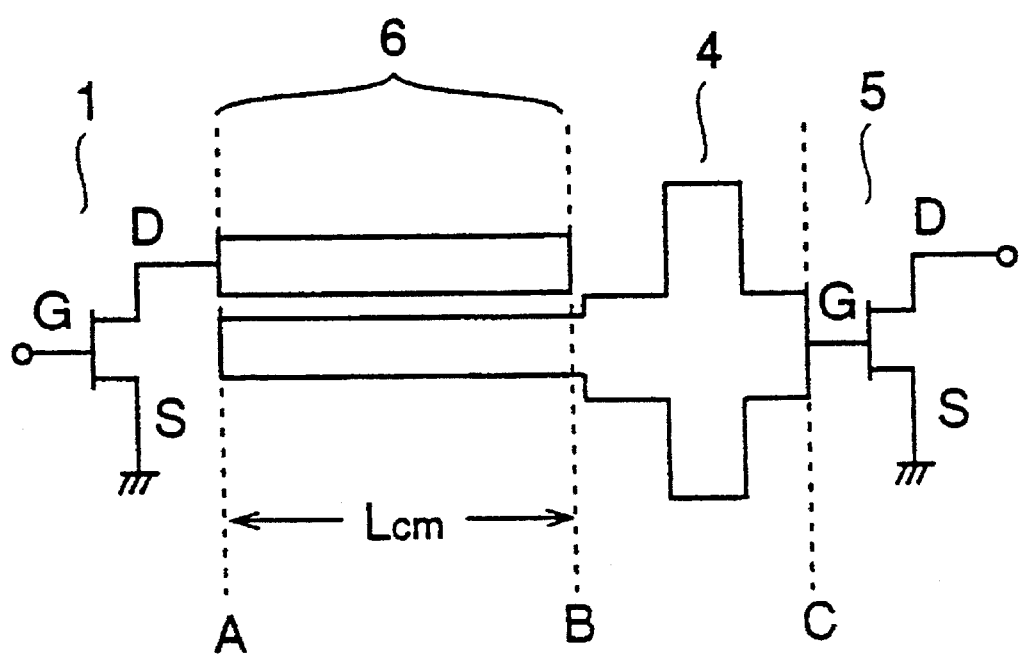
FIG. 3 is a plan view showing a two-stage amplifier employing an impedance matching circuit comprising the coupling line according to the first embodiment of the present invention.
Figure 4:
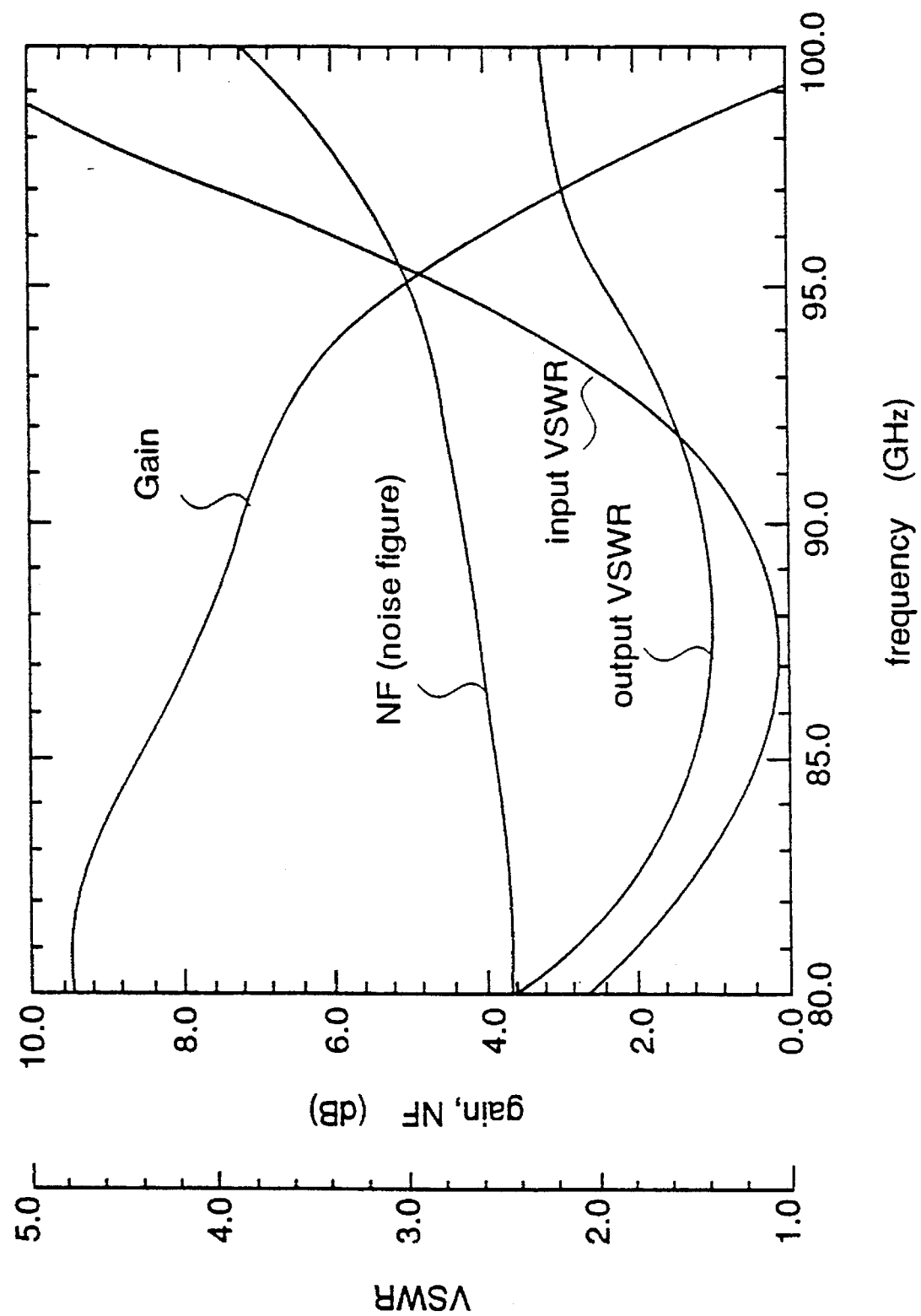
FIG. 4 is a view showing frequency dependence of various characteristics of the two-stage amplifier IC employing an impedance matching circuit comprising the coupling line according to the first embodiment of the present invention.

FIG. 3 shows a two-stage amplifier which is obtained by providing the second amplification stage connected with the impedance matching circuit of the first embodiment. In FIG. 3, reference numeral 4 designates an input side impedance matching circuit at the second amplification stage, numeral 5 designates an FET at the second amplification stage, and both of the circuit 4 and the FET 5 are impedance matched with each other at a position C. In addition, the impedance matching is performed with 50Ω at a position B. However, a dc bias circuit for driving the FET, an input side impedance matching circuit at the first amplification stage and an output side impedance matching circuit at the second amplification stage are omitted from the illustration. FIG. 4 shows the frequency dependency of various characteristics of the two-stage amplifier IC including the circuit shown in FIG. 3. Both the gain and the noise figure show preferable values in the vicinity of 90 GHz. In addition, the input VSWR and the output VSWR are controlled to be under 2.0.

As described above, since the impedance matching circuit comprising the coupling line according to the first embodiment provides the functions of both of the prior art output side impedance matching circuit and the prior art dc blocking coupling line, the chip size of the IC can be miniaturized. In addition, in the amplifier IC employing the impedance matching circuit comprising the coupling line, preferable high frequency characteristics can be obtained.

While in this first embodiment of the present invention, the impedance matching circuit comprising the coupling line is employed as an output side impedance matching circuit at the amplification stage, it may be employed as an input side impedance matching circuit. Furthermore, only the impedance matching circuit comprising the coupling line may be provided between FETs of the two amplification stages so as to directly realize impedance matching between them, whereby the chip size of the IC can be further reduced.

Embodiment 2

A second embodiment of the present invention will be described.

Figure 5:
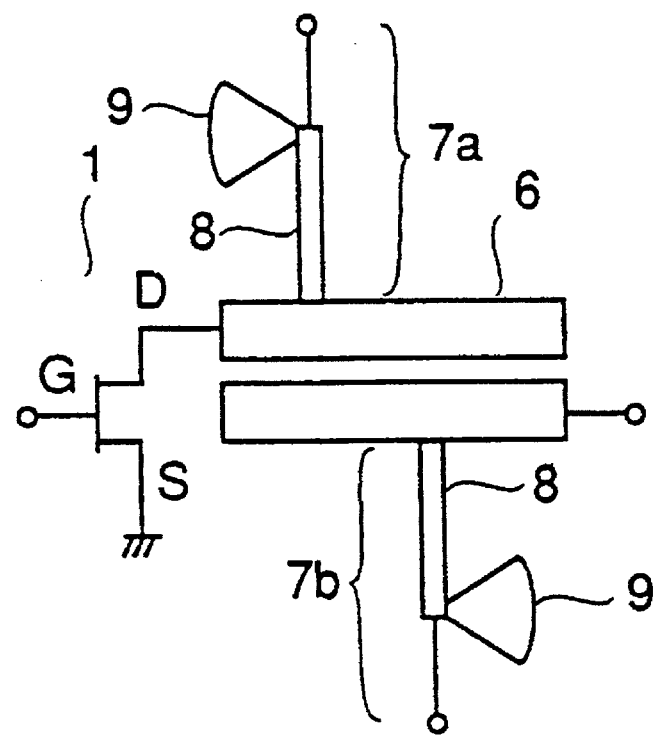
FIG. 5 is a plan view showing an impedance matching circuit comprising a coupling line to which a dc bias circuit is connected according to a second embodiment of the present invention.

FIG. 5 is a plan view illustrating an impedance matching circuit according to the second embodiment of the present invention. In FIG. 5, reference numerals 7a and 7b designate dc bias circuits, numeral 8 designates a ¼ wavelength line, and numeral 9 designates a radial stub. This circuit is realized by connecting a dc bias circuit for applying a dc bias voltage for driving the FET to the impedance matching circuit comprising the coupling line shown in the first embodiment.

Each of these dc bias circuits 7a and 7b comprises a ¼ wavelength line 8, one end of which is connected to the coupling line, and a radial stub 9 connected to the other end of the ¼ wavelength line. The configuration of the radial stub 9 can be designed so that the impedance of the dc bias circuits 7a and 7b viewed from the coupling line may be infinite at the design center frequency. In this case, since the dc bias circuit exerts no influence upon the coupling line at high frequency, the ¼ wavelength line 8 can be connected to any position of the coupling line. The dc bias circuit 7a is for applying a dc bias voltage to a drain of the FET 1, and the dc bias circuit 7b is for applying a dc bias voltage to a gate of the next-stage FET (not shown).

While in the prior art example the dc bias circuit is connected to an electrode of each FET or a transmission line in the vicinity of the electrode, the dc bias circuit can be connected to any position of the impedance matching circuit comprising the coupling line according to the second embodiment. Consequently, the degree of freedom in the circuit design for the IC is increased. Therefore, a substrate surface on which the IC is formed can be further effectively employed and the whole chip size of the IC can be further miniaturized.

Embodiment 3

A third embodiment of the present invention will be described.

Figure 6:
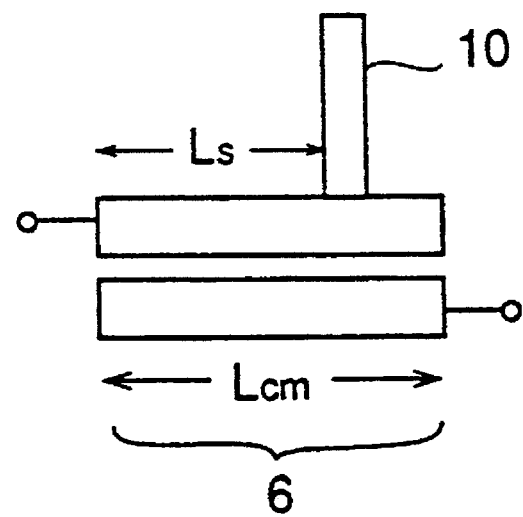
FIG. 6 is a plan view showing an impedance matching circuit comprising a coupling line to which an edge-open stub is connected according to a third embodiment of the present invention.

FIG. 6 is a plan view showing an impedance matching circuit according to the third embodiment of the present invention. In FIG. 6, reference numeral 10 designates an open end stub. The open end stub 10 is connected to the impedance matching circuit 6 comprising the coupling line shown in the first embodiment.

Figure 7:
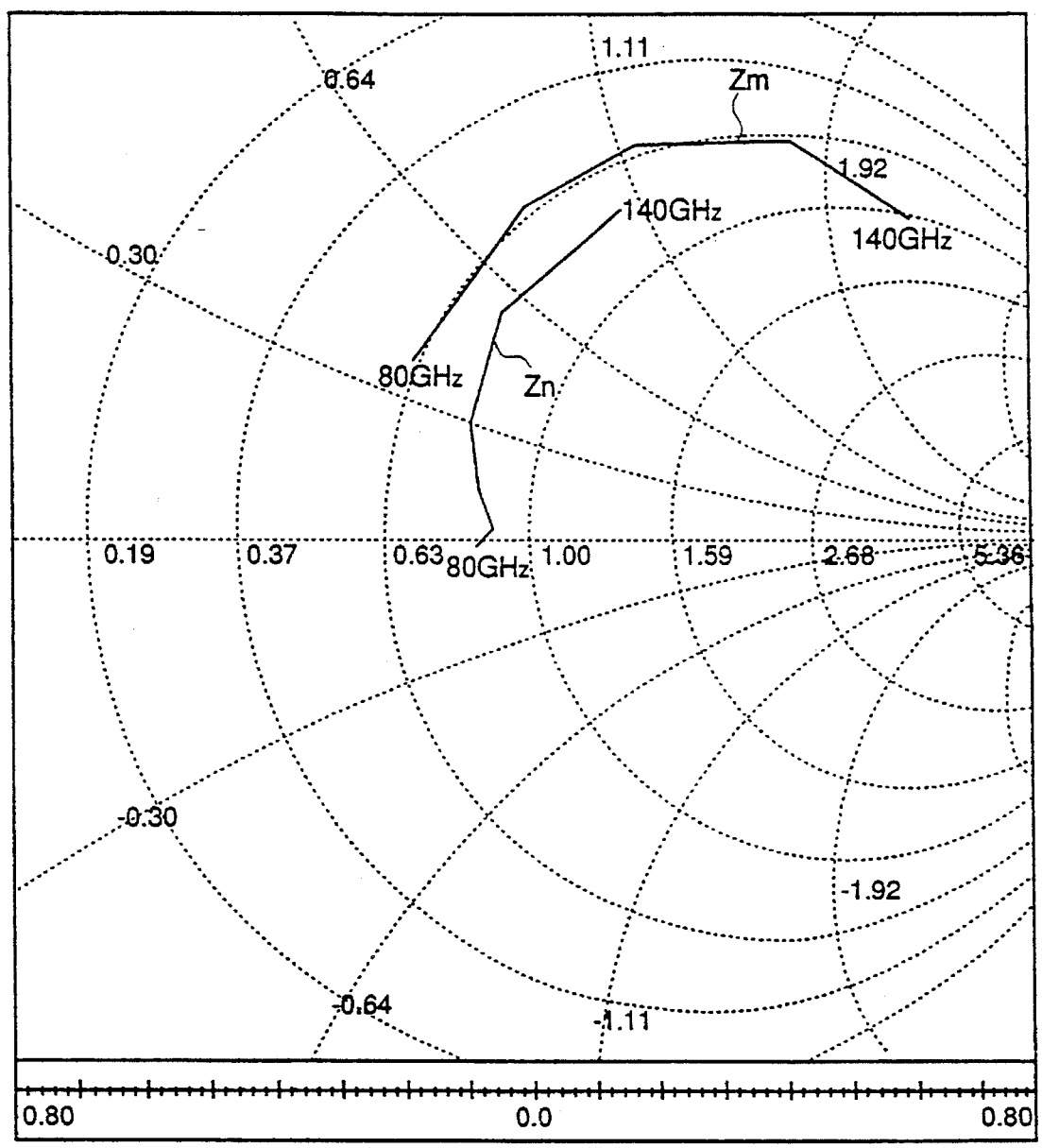
FIG. 7 is a Smith chart on which impedances of the impedance matching circuit comprising the coupling line to which the edge-open stub is connected according to the third embodiment of the present invention are presented.
Figure 8:
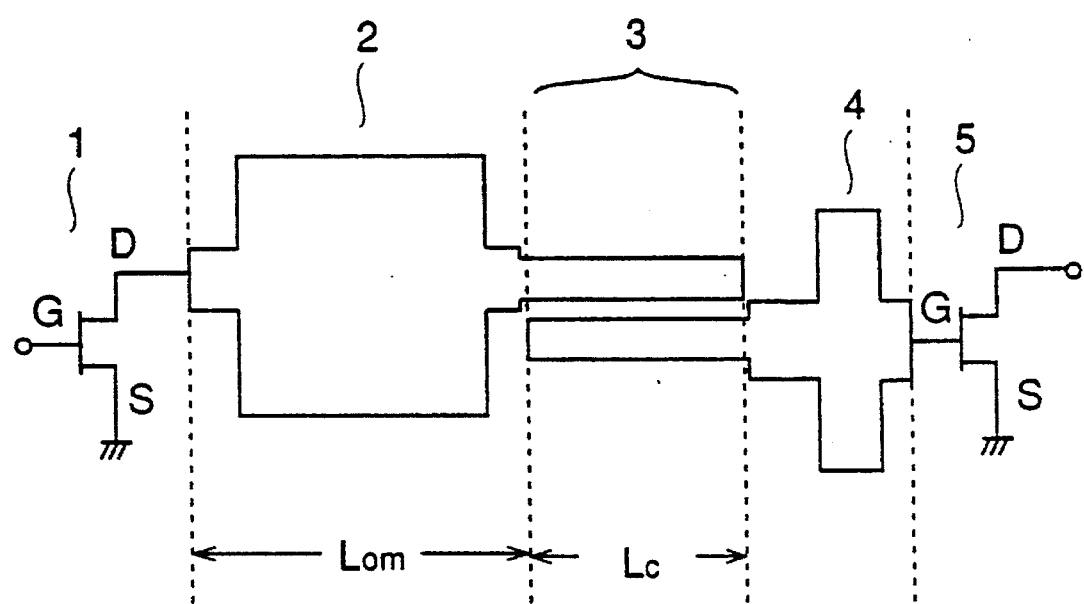
FIG. 8 is a view showing the prior art coupling line with a ¼ wavelength and impedance matching circuit.

FIG. 7 is a Smith chart on which impedance of the coupling line to which the open end stub is connected and impedance of the coupling line to which the open end stub is not connected are presented, where Zm is the impedance of the coupling line to which the open end stub is connected and Zn is the impedance of the coupling line to which the open end stub is not connected. It can be seen that the impedance of the coupling line is significantly changed by connecting the open end stub to the coupling line. In addition, the impedance of the coupling line can be changed by changing the configuration of the stub 10 and the position at which it is connected to the coupling line 6, i.e., a distance $L_s$ of FIG. 6. Therefore, the impedance matching circuit of the third embodiment can perform impedance matching over a range larger than that in the matching circuit of the first embodiment, whereby the degree of freedom in the circuit design for the IC can be further increased. In addition, the chip size of the IC can be further reduced as compared with the first embodiment.

While in the third embodiment of the present invention, an open end stub is employed, an short-circuited stub may be employed in place of the open end stub. Furthermore, the stub may be disposed on both sides of the coupling line like the dc bias circuit of the second embodiment.

What is claimed is:

1. An impedance matching circuit for use at a center frequency comprising:

first and second edge-coupled transmission lines having spaced apart coupled edges and a length between ends of the coupled edges longer than one-quarter wavelength at the center frequency; and an impedance adjusting means directly connected to one of the first and second edge-coupled transmission lines between the ends of the coupled edges.

2. The impedance matching circuit of claim 1 comprising a transistor connected to one end of one of said edge-coupled transmission lines and wherein the impedance adjusting means comprises dc bias circuits for driving said transistor connected between the ends of one of said first and second transmission lines wherein said dc bias circuits at the center frequency have infinite impedance.

3. The impedance matching circuit of claim 2 wherein the dc bias circuits include quarter wavelength transmission lines and stubs connected to said quarter wavelength transmission lines.

4. The impedance matching circuit of claim 1 wherein said impedance matching circuit is integrated in a high frequency integrated circuit.

5. A high frequency circuit designed to operate at a center frequency and having a characteristic impedance, the circuit comprising:

an amplifying element having an output impedance different from the characteristic impedance; and an impedance matching element for matching the output impedance to the characteristic impedance, directly connected to the amplifying element, and including first and second edge-coupled transmission lines having spaced apart coupled edges and a length between ends of the coupled edges longer than one-quarter wavelength at the center frequency and impedance adjusting means directly connected to one of the first and second edge-coupled transmission lines between the ends of the coupled edges.

6. The high frequency circuit of claim 5 wherein the amplifying element is a field effect transistor having a drain and the impedance matching element is connected to the drain.

7. The high frequency circuit of claim 5 wherein the impedance adjusting means includes a dc biasing circuit comprising a biasing transmission line connected to one of the first and second edge-coupled transmission lines.

8. The high frequency circuit of claim 7 wherein the biasing transmission line is one-quarter wavelength long at the center frequency.

9. The high frequency circuit of claim 8 wherein the impedance adjusting means includes a radial stub connected to the one-quarter wavelength line.

10. A high frequency circuit designed to operate at a center frequency and having, at a point within the circuit, a circuit impedance, the circuit comprising:

an amplifying element having an output impedance different from the circuit impedance; and an impedance matching element for matching the output impedance to the circuit impedance, directly connected to the amplifying element, and including first and second edge-coupled transmission lines having spaced apart coupled edges and a length between ends of the coupled edges longer than one-quarter wavelength at the center frequency and impedance adjusting means directly connected to one of the first and second edge-coupled transmission lines between the ends of the coupled edges.

11. The high frequency circuit of claim 10 wherein the amplifying element is a field effect transistor having a drain and the impedance matching element is connected to the drain.

12. The high frequency circuit of claim 10 wherein the impedance adjusting means includes a dc biasing circuit comprising a biasing transmission line connected to one of the first and second edge-coupled transmission lines.

13. The high frequency circuit of claim 12 wherein the biasing transmission line is one-quarter wavelength long at the center frequency.

14. The high frequency circuit of claim 13 wherein the impedance adjusting means includes a radial stub connected to the one-quarter wavelength line.

* * * * *